United States Patent
Huang

[11] Patent Number: 6,085,396
[45] Date of Patent: Jul. 11, 2000

[54] MANUFACTURING METHOD FOR RECTIFYING DIODES

[76] Inventor: Wen-Ping Huang, 4F, No. 18, Lane 101, Sec. 1 Chi-Lung Rd., Taipei, Taiwan

[21] Appl. No.: 09/311,573

[22] Filed: May 14, 1999

[51] Int. Cl.[7] ...................................................... H01G 7/00
[52] U.S. Cl. ........................ 29/25.42; 29/592.1; 29/825; 438/133; 438/134; 438/380; 438/460; 438/465
[58] Field of Search .............................. 29/25.42, 592.1, 29/825; 438/133, 134, 380, 460, 465

[56] References Cited

U.S. PATENT DOCUMENTS

| | | | |
|---|---|---|---|
| 5,046,236 | 9/1991 | Wada | 29/610.1 |
| 5,311,651 | 5/1994 | Kim | 29/25.42 |
| 5,401,690 | 3/1995 | Chen | 437/228 |
| 5,723,873 | 3/1998 | Yang | 257/40 |
| 5,850,332 | 12/1998 | Kunieda | 361/523 |

FOREIGN PATENT DOCUMENTS 57-162355  10/1982  Japan .
58-066348  10/1982  Japan .

Primary Examiner—Stephen F. Gerrity
Assistant Examiner—Paul Kim
Attorney, Agent, or Firm—Bacon & Thomas, PLLC

[57] ABSTRACT

A manufacturing method for rectifying diodes, wherein, a plurality of upper and lower pins are combined with a plurality of electronic chips to form a coarse blank. And then they are processed to form shaped insulating layers by molding. Each insulating layer is processed to have superficial coarseness having micro-protuberances thereon; the areas on both the lateral sides of the insulating layer are applied with electric conductive layer. The electric conductive layer is combined with the insulating layer; they are equidistantly cut with a knife into shaped rectifying diodes. The shaped rectifying diodes each is further electrically plated with a further layer of electric conductive material on both sides of the electric conductive layer to form a harder protection layer, and then finished rectifying diodes are obtained. The upper and lower pins are in the form of thin sheets, plus the small chips, the shaped rectifying diodes have small volumes. The rectifying diodes are made by mass production, hence work efficiency can be increased, while cost of production can be reduced.

6 Claims, 4 Drawing Sheets

MANUFACTURING METHOD FOR RECTIFYING DIODES

BACKGROUND OF THE INVENTION

1. Field of the Invention

The present invention is related to a manufacturing method for rectifying diodes. And especially to a method whereby a plurality of upper and lower pins are combined with a plurality of electronic chips and then are systematically processed with plastic etc. by molding for shaping, provided with superficial coarseness, applied with electric conductive material, baked for consolidated combining, and cut into shaped articles. Such rectifying diodes are made by mass production, their process of manufacturing is quick, cost is low, and the volume of each rectifying diode is small, but their effect of electric conduction is good. Thereby, effective area of a circuit board having them can be increased; on the other hand, area needed for the circuit board can be reduced. This meets requirement of small volume electronic articles.

2. Description of the Prior Art

In pursuance of progressing of times and requirements of novelty and variation, articles and utensils are required to be convenient in use and easily carried. Therefore, electronic products are mostly required to be small in volume, convenient for disposing and shipping. Portable electronic products are specially required for volume reducing in order to carry conveniently. Volume reducing of electronic products correspondingly requires small parts for the electric circuits used in the products. While rectifying diodes are essential parts in electronic products, various electronic products need rectifiers to cut out current for rectifying in order to make the electronic products in use stable.

Rectifying diodes used presently (as shown in FIG. 1) are made by punching their electric conductive copper sheets A one by one. A chip B is placed between every two shaped electric conductive copper sheets A, then an insulating layer C is shaped by molding on the two shaped electric conductive copper sheets A. Pin ends D on the two shaped electric conductive copper sheets A are bent to abut on the bottom of the insulating layer C to form a rectifying diode 70.

Such manufacturing mode has quite a lot of defects, by which, rectifying diodes can not meet the desired requirement in manufacturing and use. For example:

1) The diodes 70 must be manufactured one by one rather than by mass production, hence they are time and work consuming; efficiency of work thereof is inferior.
2) When two electric conductive copper sheets A for each diode are applied with an insulating layer C and shaped by molding, volume of the insulating layer C is larger, hence time for molding and drying is longer.
3) The insulating layer C must envelops all the electric conductive copper sheets A and the chip B, the whole volume cannot be reduced, and the volume of the rectifying diode 70 after shaping is large, the area occupied thereby on a circuit board is also large.
4) After the electric conductive copper sheets A are shaped by molding, the pin ends D of the two electric conductive copper sheets A must be bent. While if the left and the right pin ends D are unequally bent during bending process, the left and the right pin ends D of the rectifying diode completed are not even and are subjected to loosening and shaking. When the rectifying diode 70 is mounted on a circuit board in such non well-connected state, current flow will be adversely influenced.
5) When the pin ends D of the two electric conductive copper sheets A are bent, bending force must be moderate in order not to break the pin ends D. Bends of the pin ends D are subjected to crack by stress concentration, thereby the chip B will have small crackles, and life of use thereof will be reduced.
6) When the pin ends D of the two electric conductive copper sheets A are bent, the rectifying diode 70 is subjected to damage by undue bending. Therefore, rate of bad products is increased.
7) Time for manufacturing such a rectifying diode 70 is longer, yet it can not made by mass production; bad products can be given out easily. Manufacturing of such rectifying diodes 70 is bothersome, and cost of manufacturing is higher.

The above stated problems in the known manufacturing mode of rectifying diodes 70 is inevitable, and the rectifying diodes 70 made are inferior in quality, higher in cost, time and work consuming, larger in volume, require larger occupation area on circuit boards and not suitable for small circuit boards. All these problems are expected for solution eagerly.

SUMMARY OF THE INVENTION

Accordingly, in view that rectifying diodes are essential parts in electronic products, while the manufacturing methods used presently for rectifying diodes include lot of problems and are expected for improvement. The inventor provides the present invention after hard study, improvement, and repeated experiments and tests based on his rich experience of designing, manufacturing and selling of years of such products. By the present invention, a plurality of upper and lower pins are put together with a plurality of electronic chips. They are processed by firing for combining; and then are systematically processed with plastic etc. by molding for shaping; processed to be provided with superficial coarseness; applied with a layer of electric conductive material; baked for consolidated combining; and cut into shaped articles. The rectifying diodes are manufactured by mass production to reduce their cost, and get advantages of reducing rate of failure in quality, reducing time and work consuming and having smaller volume.

The main object of the present invention is to provide a rectifying diode by the following steps: a plurality of upper and lower pins are put together with a plurality of electronic chips, they are processed by firing for combining; and then are systematically processed with plastic etc. by molding for shaping; processed to be provided with superficial coarseness; applied with a layer of electric conductive material; baked for consolidated combining; and cut into shaped articles.

The secondary object of the present invention is to provide a rectifying diode which requires smaller occupation area on a circuit board to reduce the required volume of the circuit board, thus it is suitable for a small circuit board.

Another object of the present invention is to provide a rectifying diode by mass production to reduce its cost, and reduce time and work consuming to thereby increase efficiency of work.

Another object of the present invention is to provide a rectifying diode which is light, thin and small to thereby reduce its cost of production.

The present invention will be apparent in the mode of manufacturing, and the structural characteristics thereof after reading the detailed description of the preferred embodiment thereof in reference to the accompanying drawings.

DETAILED DESCRIPTION OF THE PREFERRED EMBODIMENT

Figure 1A:
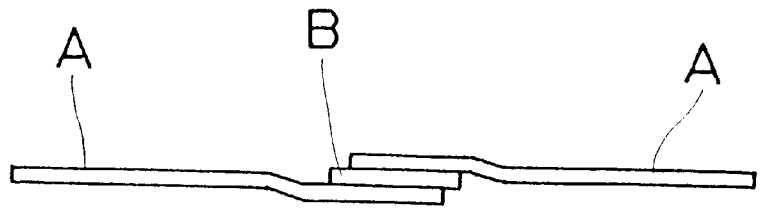
FIGS. 1A–1C are a schematic view showing the mode of manufacturing of a conventional rectifying diode.
Figure 1B:
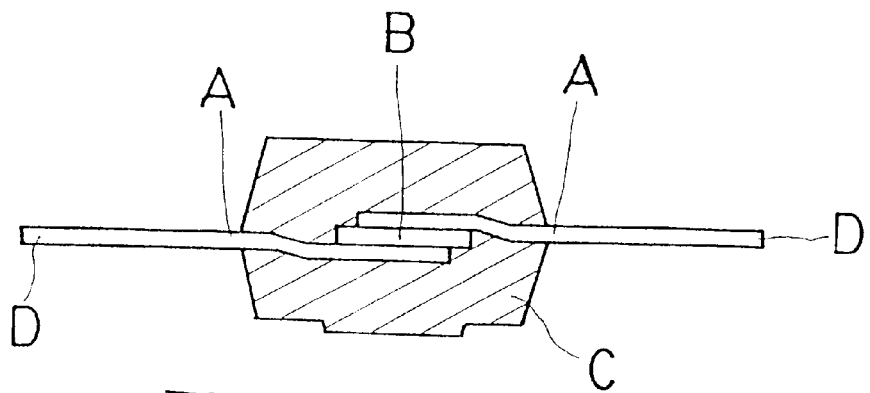
Figure 1C:
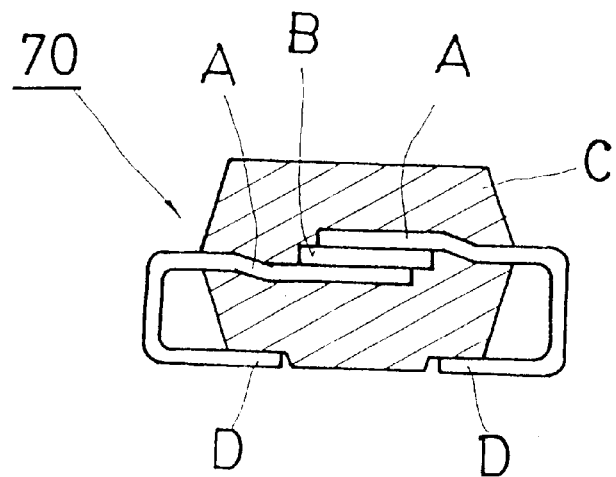
Figure 2A:
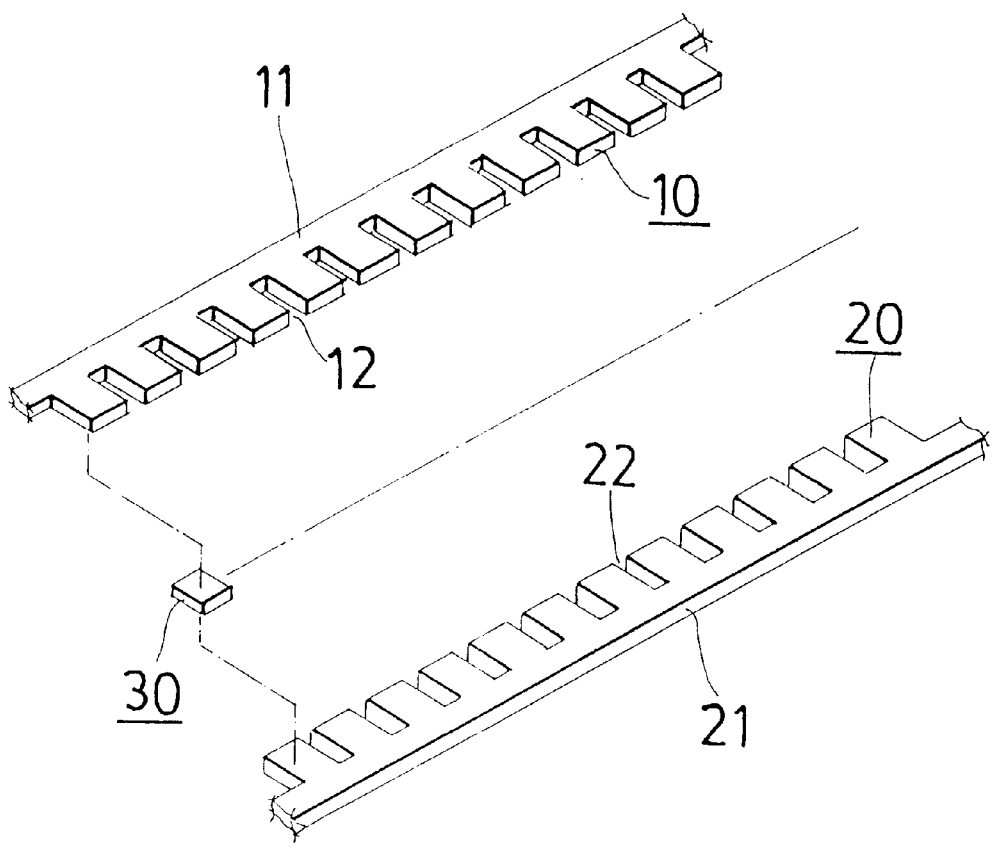
FIGS. 2A–2B are a schematic view showing the mode of manufacturing of a rectifying diode the present invention.
Figure 2B:
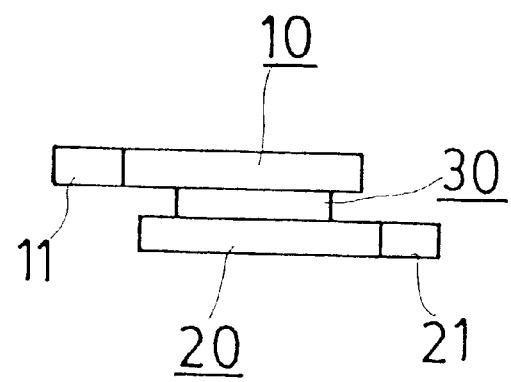
Figure 3:
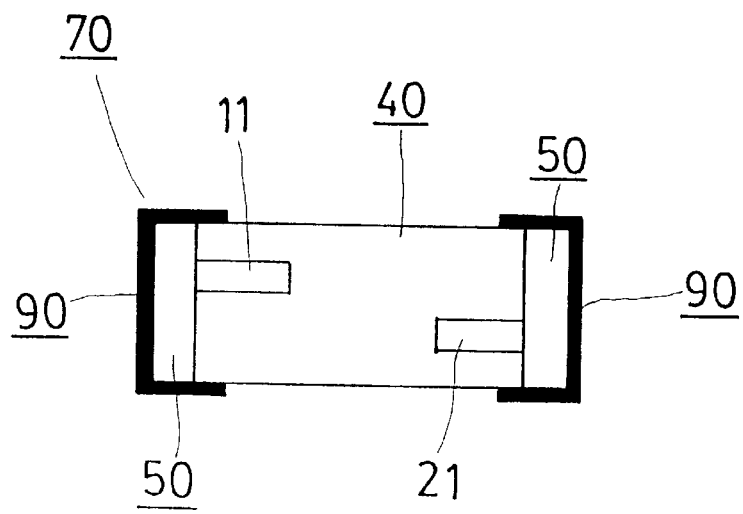
FIG. 3 is a schematic perspective view showing the mode of manufacturing of the present invention.

Referring to FIGS. 2A–2B, 3 and 4A–4B, the present invention is to manufacture a plurality of rectifying diodes 70 with a plurality of upper pins 10 and lower pins 20. Wherein, the upper pins 10 integrally connecting to an upper connecting bar 11 are put together with the lower pins 20 integrally connecting to a lower connecting bar 21. The upper pins 10 is formed with a plurality of upper gaps 12, and the lower pins 20 is formed with a plurality of lower gaps 22. An electronic chip 30 is placed between each upper pin 10 and its corresponding lower pin 20, they are all together processed by firing for combining. And then they are processed to be shaped with plastic etc. by molding to form an insulating layer 40, thus a coarse blank 71 is obtained. The upper connecting bar 11 on the upper pins 10 and the lower connecting bar 21 on the lower pins 20 are located at the two lateral sides of the insulating layer 40. The insulating layer 40 is processed to have superficial coarseness or micro-protuberances on the surfaces of the insulating layer 40. Thereafter, the areas on both the lateral sides of the insulating layer 40 where the upper connecting bar 11 and the lower connecting bar 21 are exposed are applied with electric conductive material to form an electric conductive layer 50 (applied with silver or copper such as by screen printing, tray method of dyeing, splashing plating and spraying). The electric conductive layer 50 is baked and dried for consolidated combining with the insulating layer 40, and is equidistantly cut at the gaps 12, 22 with a knife 80 into shaped rectifying diodes 70 together with the insulating layer 40.

Figure 4A:
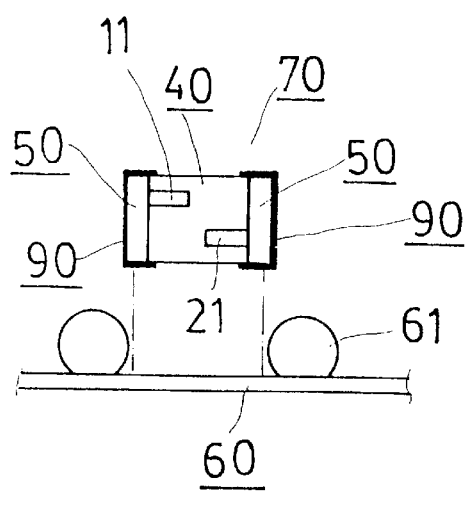
FIGS. 4A–4B are a view showing the structure and the mode of manufacturing present invention.
Figure 4B:
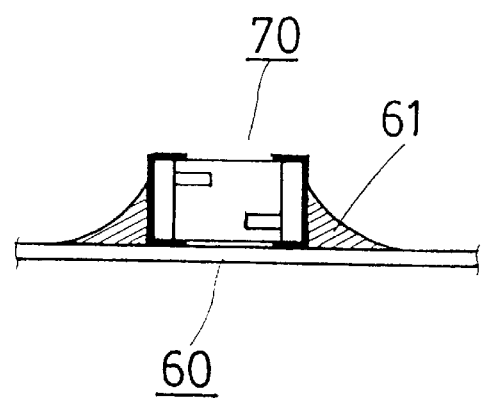
Figure 5A:
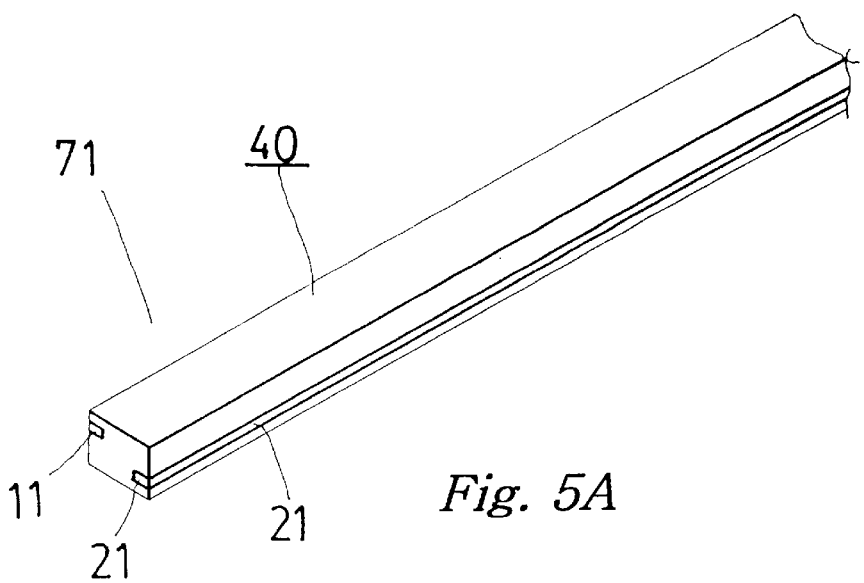
FIGS. 5A–5C are a schematic view showing use of the present invention.
Figure 5B:
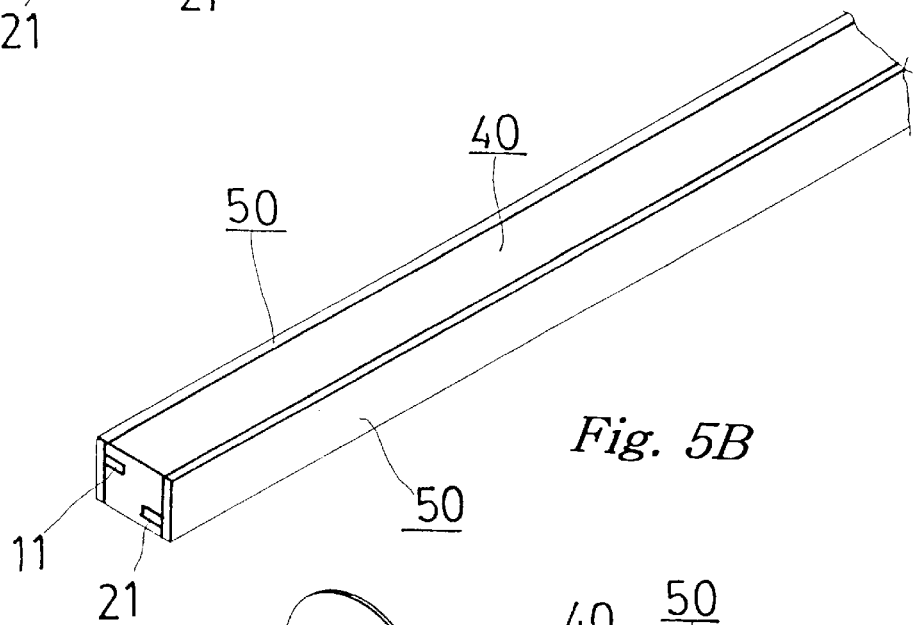
Figure 5C:
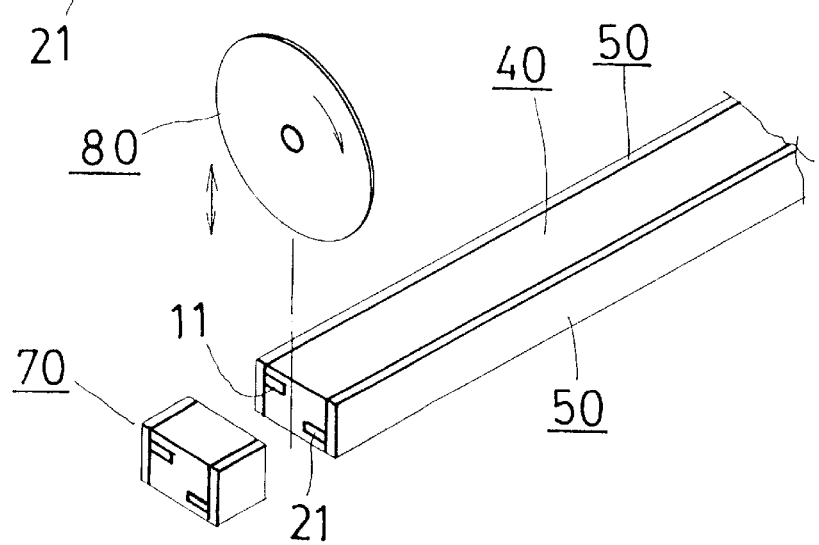

Each of the shaped rectifying diodes 70 (as shown in FIGS. 4A–4B) is further electrically plated with a further layer of electric conductive material 90 on both sides of the electric conductive layer 50 to form a weldable protection layer (the insulating material 90 can be made of nickel, tin or lead etc.). Thereby, the exterior electric conductive layer 50 is provided with a harder protection layer, this article is tested and then the finished rectifying diodes 70 is obtained. The processes of manufacturing for the rectifying diodes 70 of the present invention can be serially connected to form a systematical process.

After completion of manufacturing of the rectifying diodes 70 of the present invention, the upper connecting bar 11 and the lower connecting bar 21 are exposed at both lateral sides of each rectifying diode 70. Heat generated during using of the rectifying diode 70 is discharged out of the exposing areas of the upper connecting bar 11 and the lower connecting bar 21, thereby the areas have the function of heat sinking.

Referring to FIGS. 4A–4B, the rectifying diode 70 of the present invention has a small volume, does not occupy too much space on a circuit board 60. When in use, the circuit board 60 is provided thereon with a solder 61. Then the rectifying diode 70 is placed on the solder 61 to let the latter extend to the whole length of both lateral sides of the rectifying diode 70 to make combination of them without drilling holes on the circuit board 60 for pins.

An upper pin 10 and a lower pin 20 of the present invention (as shown in FIGS. 1A–1C and 3) are very thin, plus an extremely small electronic chip 30, the coarse blank 71 with a small volume is formed. The coarse blank 71 is added with the insulating layer 40 by molding, material required for the insulating layer 40 is little, hence the finally shaped rectifying diode 70 does not have too big volume (as shown in FIGS. 4A–4B) and thereby can be used on a small circuit board. In this way, the volume of an electronic article made therefrom has a small volume too.

In conclusion, the present invention manufactures rectifying diodes by systematical mass production, the shaped rectifying diodes have small volumes, require smaller occupation areas on circuit boards, and have the advantages of reducing rate of failure in quality and reducing time and work consuming, reducing cost and processing time.

What are shown in the drawings are only for illustrating a preferred embodiment of the present invention, and not for giving any limitation to the scope of the present invention. Accordingly, my invention may assume numerous forms and is to be construed as including all modifications and variations falling within the scope of the appended claims. Having thus described my invention, what I claim as new and desire to be secured by Letters Patent of the United States are:

1. A manufacturing method for rectifying diodes, wherein, said rectifying diodes are manufactured by combination of a plurality of upper pins, lower pins and electronic chips;

said upper and lower pins and said electronic chips are processed by firing for combining, and then are processed by molding to form a shaped insulating layer;

said insulating layer is then processed to be provided with superficial coarseness having micro-protuberances on the surfaces thereof, and is applied on both lateral sides thereof with a layer of electric conductive material;

said electric conductive layer is baked and dried for consolidated combining of said insulating layer and said electric conductive layer;

said insulating layer and said electric conductive layer together are equidistantly cut with a knife into shaped rectifying diodes;

said shaped rectifying diodes are each further electrically plated with a further layer of electric conductive material on both sides of said electric conductive layer to form a harder protection layer, and then said finished rectifying diodes are obtained.

2. A manufacturing method for rectifying diodes as claimed in claim 1, wherein, said upper pins are integrally connected to an upper connecting bar and are formed with a plurality of upper gaps.

3. A manufacturing method for rectifying diodes as claimed in claim 1, wherein, said lower pins are integrally connected to a lower connecting bar and are formed with a plurality of lower gaps.

4. A manufacturing method for rectifying diodes as claimed in claim 1, wherein, said electric conductive material forming said harder protection layer is applied by screen printing, tray method of dyeing, splashing plating or spraying.

5. The manufacturing method for rectifying diodes as claimed in claim 1, wherein, said upper pins are integrally connected to an upper connecting bar and are formed with a plurality of upper gaps; said lower pins are integrally connected to a lower connecting bar and are formed with a plurality of lower gaps.

6. A manufacturing method for rectifying diodes as claimed in claim 5, wherein, said upper connecting bar and said lower connecting bar are exposed at both lateral sides of each of said rectifying diodes after completion of manufacturing of said rectifying diodes;

heat generated during using of said rectifying diode is discharged out of the exposing areas of said upper connecting bar and said lower connecting bar, thereby said exposing areas have the function of heat sinking.

* * * * *